(12) United States Patent
Matsunaga et al.

(10) Patent No.: US 7,423,728 B2
(45) Date of Patent: Sep. 9, 2008

(54) IMMERSION EXPOSURE METHOD AND APPARATUS, AND MANUFACTURING METHOD OF A SEMICONDUCTOR DEVICE

(75) Inventors: Kentaro Matsunaga, Yokohama (JP); Takuya Kono, Yokohama (JP); Shinichi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 184 days.

(21) Appl. No.: 11/315,000

(22) Filed: Dec. 23, 2005

(65) Prior Publication Data
US 2006/0177776 A1 Aug. 10, 2006

(30) Foreign Application Priority Data
Dec. 27, 2004 (JP) .............................. 2004-378299

(51) Int. Cl.
*G03B 27/54* (2006.01)
(52) U.S. Cl. .............................. 355/67; 355/71; 355/72; 378/34
(58) Field of Classification Search .................. 355/30, 355/67
See application file for complete search history.

(56) References Cited
U.S. PATENT DOCUMENTS
2004/0207824 A1 10/2004 Lof et al.
2005/0175776 A1* 8/2005 Streefkerk et al. .......... 427/256
2005/0221234 A1 10/2005 Ito
2005/0237504 A1* 10/2005 Nagasaka et al. ............. 355/53

FOREIGN PATENT DOCUMENTS
| JP | 10-303114 | 11/1998 |
| JP | 2005-33204 | 2/2005 |
| JP | 2005-109146 | 4/2005 |
| WO | WO 2004/112108 A1 | 12/2004 |

OTHER PUBLICATIONS

Notification for Filing Opinion mailed by the Korean Patent Office on Nov. 23, 2006, in counterpart Korean Patent Application 10-2005-129525.
Onishi et al., "Method For Manufacturing Semiconductor Device", U.S. Appl. No. 11/174,720, filed Jul. 6, 2005.

* cited by examiner

*Primary Examiner*—Della J. Rutledge
(74) *Attorney, Agent, or Firm*—Finnegan, Henderson, Farabow, Garrett & Dunner, L.L.P.

(57) ABSTRACT

There is disclosed an immersion exposure method of carrying out an exposure process in a state that liquid is at least partly filled between a substrate to be exposed and a projection optical system of an exposure apparatus carrying out the exposure process, comprising carrying out a process of making large a contact angle to the liquid with at least outer peripheral portion of a main surface of the substrate compared with a contact angle to the liquid with an area adjacent to the outer peripheral portion of the substrate, which area is a part of a surface of a substrate supporting side of a substrate support member supporting the substrate included in the exposure apparatus, and carrying out the exposure process.

20 Claims, 3 Drawing Sheets

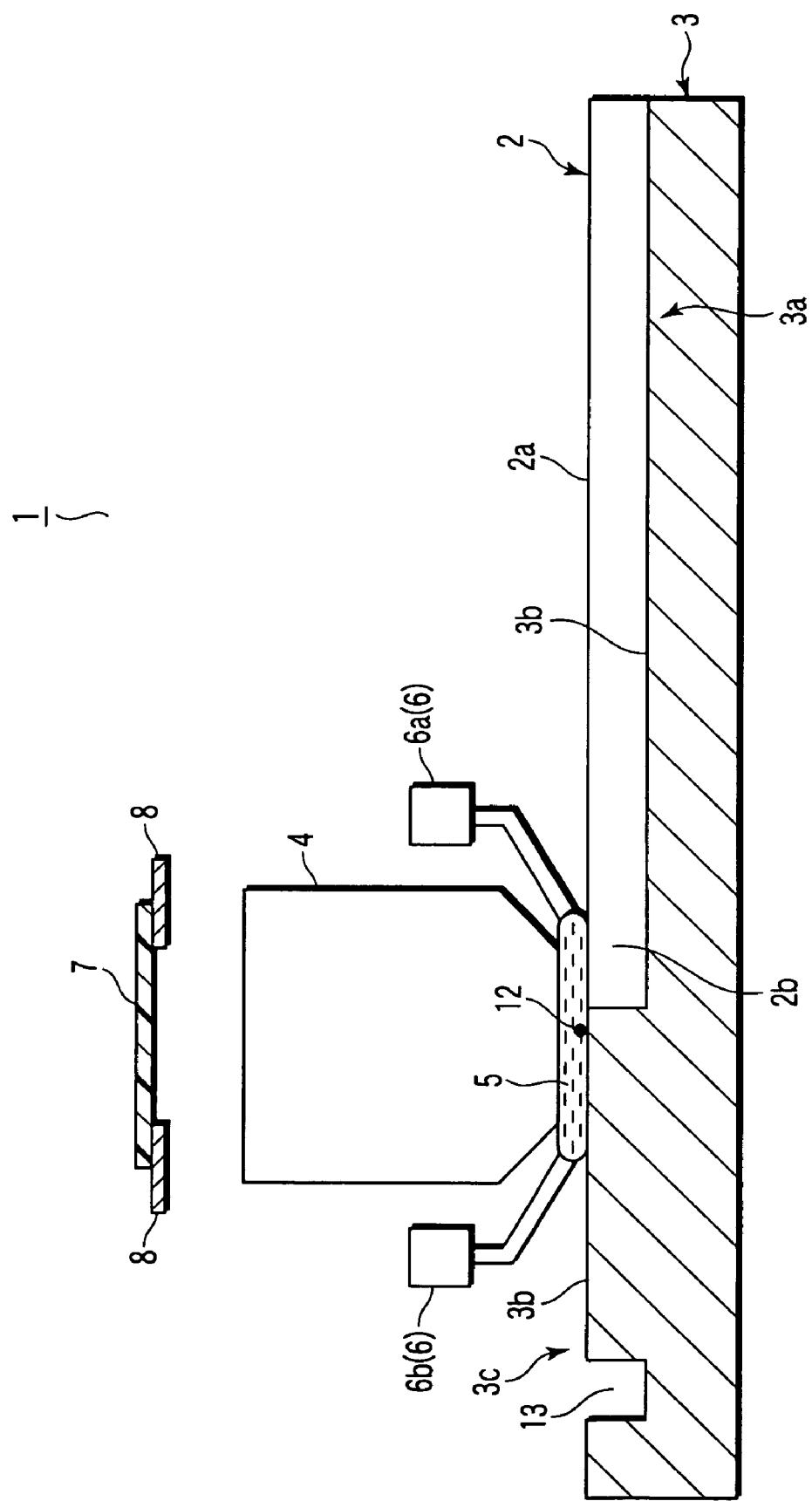

IMMERSION EXPOSURE METHOD AND APPARATUS, AND MANUFACTURING METHOD OF A SEMICONDUCTOR DEVICE

CROSS-REFERENCE TO RELATED APPLICATIONS

This application is based upon and claims the benefit of priority from prior Japanese Patent Application No. 2004-378299, filed Dec. 27, 2004, the entire contents of which are incorporated herein by reference.

BACKGROUND OF THE INVENTION

1. Field of the Invention

The present invention relates to a technique of manufacturing a semiconductor device. In particular, the present invention relates to immersion exposure method and apparatus, which can prevent substrate from being contaminated in an immersion exposure process of carrying out exposure in a state that a liquid is filled between a projection optical system of an exposure apparatus (stepper or scanner) and a substrate subjected to an exposure process. Moreover, the present invention relates to a manufacturing method of a semiconductor device.

2. Description of the Related Art

Recently, an exposure apparatus calling an immersion exposure apparatus and an exposure method calling an immersion exposure method of using the immersion exposure apparatus, have attracted special interest. The foregoing technique has been disclosed in JPN. PAT. APPLN. KOKAI Publication No. 10-303114, for example. In brief, the foregoing immersion exposure apparatus is an apparatus for exposing a resist layer in a state that a liquid calling immersion liquid is filled between the surface of the resist layer formed on a substrate to be exposed and a projection optical system of the exposure system. The foregoing immersion exposure method is a method of carrying out exposure using the apparatus for immersion exposure.

In a general immersion exposure apparatus, various devices and structures are arranged at an outer periphery of an exposure stage. Specifically, there are arranged equipment for measuring positional precision of an exposure state on which a substrate is placed, various wirings, principal devices and structures having a need to avoid a contact with immersion liquid. There is a high possibility that these devices and structures break down if they contact with the immersion liquid. For example, in the immersion exposure apparatus, a contact angle of the outer peripheral surface of the exposure stage with respect to the immersion liquid is set smaller. Specifically, in an immersion exposure apparatus using water as immersion liquid, the outer peripheral surface of the exposure stage is set in a state of having high hydrophilicity, that is, low water repellency. In this case, when exposing the outer periphery of a substrate to be exposed, immersion liquid is immersed in the outer periphery of the exposure stage. For this reason, the immersion liquid contacts with devices and structures arranged at the outer periphery of the exposure stage. Thus, there is a high possibility that these devices and structures break down. In order to solve the foregoing problem, the apparatus for immersion exposure has the structure given below. That is, a contact angle of the outer peripheral surface of the exposure stage to the immersion liquid is set very larger so that the immersion liquid does not contact with the outer peripheral surface of the exposure stage. Specifically, in the immersion exposure apparatus using water as immersion liquid, the outer peripheral surface of the exposure stage is set in a state of having low hydrophilicity, that is, a state of performing high water repellency.

For example, the contact angle of the surface of the substrate to be exposed with respect to the immersion liquid is smaller than that of the outer peripheral surface of the exposure stage. In this case, if the immersion liquid is positioned ranging over both exposure state and wafer, the immersion liquid is easy to be moved from the outer periphery of the exposure stage toward the substrate to be exposed. For example, the immersion liquid is further readily moved from the outer periphery of the exposure stage toward the substrate to be exposed in the following cases. One is the case of exposing the outer periphery of the substrate to be exposed. Another is the case where a projection optical system of an exposure system comes into an exposure state from an exposure standby state or a revise state such as exposure correction. Another is the case where the projection optical system moves on the outer periphery of the exposure stage. More specifically, the immersion liquid is further readily moved from the outer periphery of the exposure stage toward the substrate to be exposed in the following cases. One is the case where the immersion liquid exists on both surfaces of the substrate to be exposed and the outer periphery of the exposure stage. Another is the case where the projection optical system of the exposure system exists in the vicinity of the outer periphery of the substrate to be exposed.

In such a case, if impurity existing on the outer periphery of the exposure stage is covered with the immersion liquid, a possibility that the following phenomenon occurs is very high. Specifically, the impurity moves from the outer periphery of the exposure stage toward the substrate because it goes with a flow of the immersion liquid moving from the same as above toward the substrate. The impurity moves as described above, and thereby, the surface of the substrate to be exposed is contaminated. This is a factor of causing the following problem. That is, when exposing or forming a pattern, a possibility that defect occurs in the pattern becomes extremely high. As a result, performance, quality and reliability of semiconductor devices are reduced; for this reason, a rate of manufacturing defective products increases. In addition, the yield of the manufacturing process of the semiconductor devices is reduced.

BRIEF SUMMARY OF THE INVENTION

According to an aspect of the invention, there is provided an immersion exposure method of carrying out an exposure process in a state that liquid is at least partly filled between a substrate to be exposed and a projection optical system of an exposure apparatus to carry out the exposure process, comprising: carrying out a process of making a large contact angle between the liquid and at least an outer peripheral portion of a main surface of the substrate when compared with a contact angle between the liquid and an area adjacent to the outer peripheral portion of the substrate, the area being a part of a surface of a substrate supporting side of a substrate support member to support the substrate included in the exposure apparatus; and carrying out the exposure process.

According to another aspect of the invention, there is provided an immersion exposure method of carrying out an exposure process in a state that liquid is at least partly filled between a substrate to be exposed and a projection optical system of an exposure apparatus to carry out the exposure process, comprising: providing an absorption layer contacting with the liquid at a first angle on a main surface of a side to be exposed of the substrate; providing a resist layer on the absorption layer and on a surface facing the projection optical system; providing a protection layer contacting with the liquid at a second angle and covering the resist layer, the protection layer being provided on the surface facing the projection optical system; supporting the substrate provided with the absorption layer, the resist layer, and the protection layer by a substrate support member included in the exposure apparatus, and providing an auxiliary member contacting with the liquid at an angle smaller than the first angle at an area adjacent to the outer peripheral portion of the substrate, the area being a part of a surface layer of the substrate supporting side of the substrate support member; carrying out the exposure process with respect to the substrate; and developing a pattern exposed to the resist layer by the exposure process.

According to another aspect of the invention, there is provided an immersion exposure apparatus, comprising: a substrate support member to support a substrate which is exposed to a pattern by an exposure process; and a projection optical system to project the pattern to the substrate, wherein the apparatus is configured to carry out the exposure process after carrying out a process of making a large contact angle between the liquid and at least an outer peripheral portion of a main surface of the substrate when compared with a contact angle between the liquid and an area adjacent to the outer peripheral portion of the substrate, the area being a part of a surface of a substrate supporting side of a substrate support member to support the substrate included in the exposure apparatus; and the apparatus carrying out the exposure process in a state that liquid is at least partly filled between the substrate and the projection optical system, and a surface outside the an outer peripheral portion of the substrate supported by the substrate support member, the surface being a part of a surface of a substrate supporting side of the substrate support member, is set to a state that a contact angle of the liquid becomes small continuously or intermittently from the outer peripheral portion of the substrate toward the surface outside the outer peripheral portion.

According to yet another aspect of the invention, there is provided a manufacturing method of a semiconductor device, carrying out an exposure process in a state that liquid is at least partly filled between a semiconductor substrate to be exposed and a projection optical system of an exposure apparatus carrying out the exposure process, comprising: carrying out a process of making a large contact angle between the liquid and at least an outer peripheral portion of a main surface of the semiconductor substrate when compared with a contact angle between the liquid and an area adjacent to the outer peripheral portion of the semiconductor substrate, the area being a part of a surface of a substrate supporting side of a substrate support member to support the semiconductor substrate included in the exposure apparatus; and forming a pattern on the main surface of the semiconductor substrate by carrying out the exposure process.

According to still another aspect of the invention, there is provided a manufacturing method of a semiconductor device, carrying out an exposure process in a state that liquid is at least partly filled between a semiconductor substrate to be exposed and a projection optical system of an exposure apparatus to carry out the exposure process, comprising: forming an absorption layer contacting with the liquid at a first angle on a main surface of a side to be exposed of the semiconductor substrate; providing a resist layer on the absorption layer and on a surface facing the projection optical system; providing a protection layer contacting with the liquid at a second angle and covering the resist layer, the protection layer being provided on the surface facing the projection optical system; supporting the semiconductor substrate provided with the absorption layer, the resist layer, and the protection layer by a substrate support member included in the exposure apparatus, and providing an auxiliary member contacting with the liquid at an angle smaller than the first angle at an area adjacent to the outer peripheral portion of the semiconductor substrate, the area being a part of a surface layer of the substrate supporting side of the substrate support member; exposing a pattern onto the resist layer by carrying out the exposure process with respect to the semiconductor substrate; and forming the pattern on the main surface of the semiconductor substrate by developing the pattern.

BRIEF DESCRIPTION OF THE SEVERAL VIEWS OF THE DRAWING

FIG. 3 is a cross-sectional view schematically showing a state of exposing the outer peripheral portion of a semiconductor device in immersion exposure method and apparatus according to the first embodiment;

DETAILED DESCRIPTION OF THE INVENTION

Embodiments of the present invention will be described below with reference to the accompanying drawings.

First Embodiment

Figure 1:
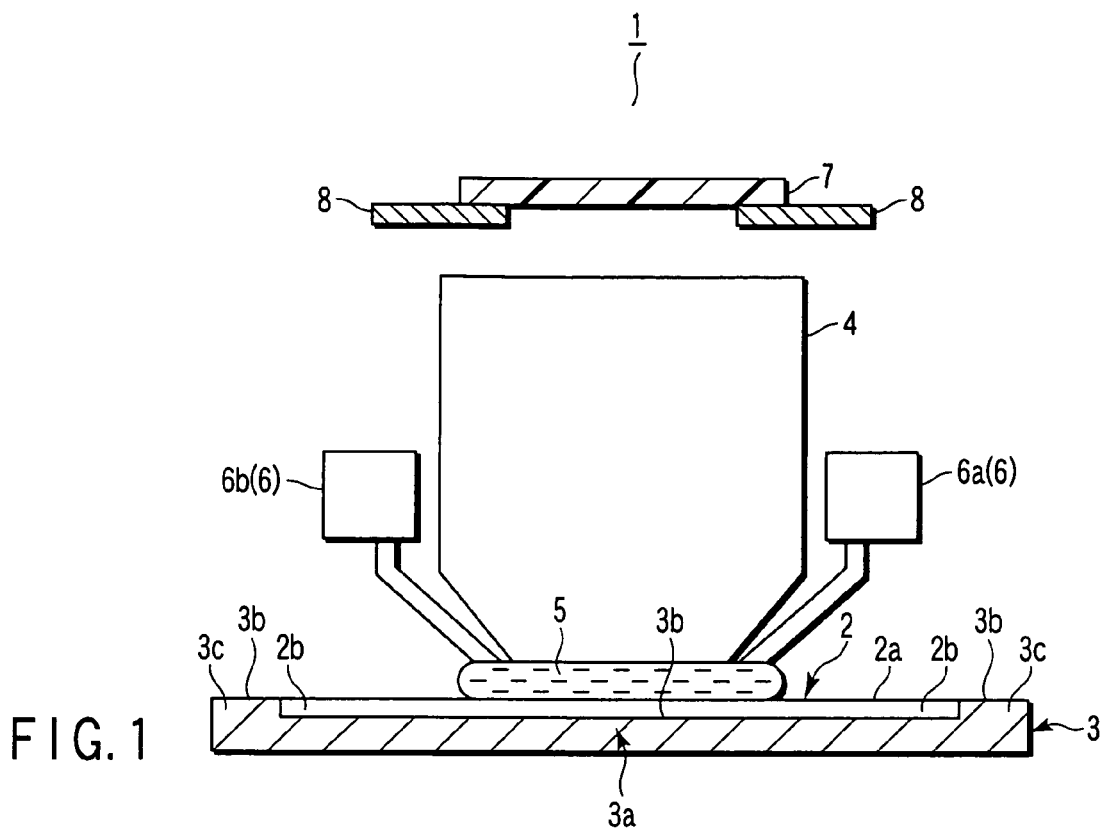
FIG. 1 is a cross-sectional view to schematically showing immersion exposure method and apparatus according to a first embodiment.
Figure 2:
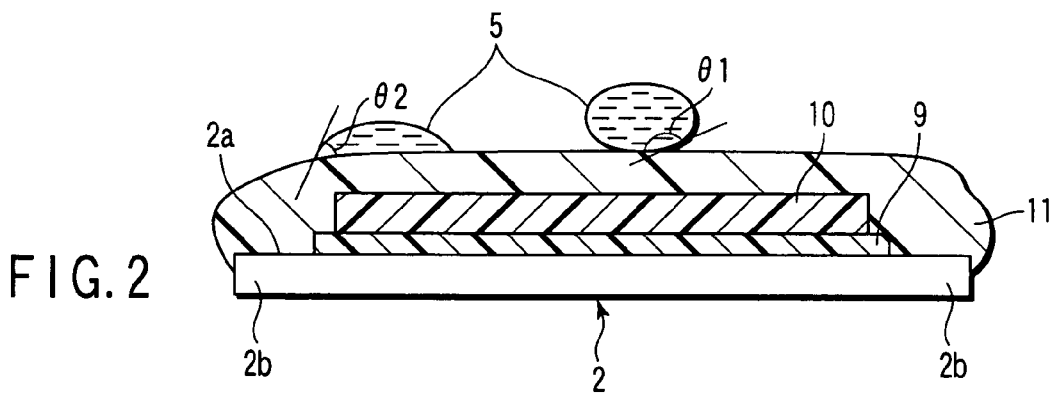
FIG. 2 is a cross-sectional view schematically showing the structure of a semiconductor substrate according to a first embodiment.

A first embodiment of the present invention will be explained below with reference to FIG. 1 to FIG. 3. FIG. 1 is a cross-sectional view to schematically showing immersion exposure method and apparatus according to the first embodiment. FIG. 2 is a cross-sectional view schematically showing the structure of a semiconductor substrate according to the first embodiment. FIG. 3 is a cross-sectional view schematically showing a state of exposing the outer peripheral portion of a semiconductor device in method and apparatus for immersion exposure according to the first embodiment.

In this embodiment, immersion exposure method and apparatus will be detailedly explained below. The immersion exposure apparatus is provided with a substrate support member. In order to prevent contaminations on the outer side of the substrate support member from attaching to the surface, side and backside of a substrate to be processed, the following structure is given. A contact angle of the surface of the substrate to be processed to liquid is set larger than that of the surface of the outer peripheral portion of the substrate support member to liquid. By doing so, the surface of the substrate to be processed is subjected to exposure treatment. Moreover, an immersion exposure apparatus including a substrate support member having the following surface will be explained later. That is, the contact angle of the surface of the outer peripheral portion of the substrate support member to liquid is set smaller than that of the surface of the substrate to be processed to liquid.

An immersion exposure apparatus 1 of the first embodiment will be explained below with reference to FIG. 1. The immersion exposure apparatus 1 is, more specifically, an immersion type scan exposure apparatus. The immersion type scan exposure apparatus 1 is provided with a substrate support member 3, which supports a substrate 2 to be processed. The substrate 2 to be processed is exposed so that a pattern is exposed thereon. Specifically, the substrate support member 3 is a wafer stage in which a wafer (semiconductor substrate) as the substrate 2 to be processed is placed on one main surface of the member. According to the first embodiment, the wafer 2 is placed on a central portion 3a of the wafer stage 3. In the following description, the central portion 3a of the wafer stage 3 is referred as a substrate support portion or wafer placement portion.

A projection optical system 4 of the exposure apparatus 1 is provided facing one main surface (surface) 3b of the wafer stage 3 on which the wafer 2 is placed. The projection optical system 4 projects and exposes a pattern on one main surface (surface) 2a of the wafer 2. In FIG. 1, only projection lens 4 is shown as a typical projection optical system of the exposure apparatus 1.

The side of the projection lens 4 is provided with liquid supply/drain unit 6. The liquid supply/drain unit 6 supplies exposure liquid 5 between the projection lens 4 and the surface 2a of the wafer 2 while drains the liquid 5 given as unnecessary from between them. In the first embodiment, the liquid supply/drain unit 6, that is, a liquid supply unit 6a is arranged on the right side of the projection lens 4. The liquid supply unit 6 supplies an exposure liquid, that is, immersion liquid 5 between the projection lens 4 and the surface 2a of the wafer 2. On the other hand, the liquid supply/drain unit 6, that is, a liquid drain unit 6b is arranged on the left side of the projection lens 4. The liquid drain unit 6b drains (removes) the immersion liquid 5 given as unnecessary from between the projection lens 4 and the surface 2a of the wafer 2. In the first embodiment, pure water is used as the immersion liquid 5.

Moreover, the side opposite to the wafer stage 3 via the projection lens is provided with a reticle stage 8 as a reticle support member. The reticle stage 8 supports a reticle 7 formed with a pattern to be projected to the wafer 2. Although no illustration is given, the pattern (mask pattern) formed on the reticle 7 is illuminated by exposure light emitted from an illumination optical system of the exposure apparatus 1. By doing so, a mask pattern image is incident on the projection lens 4. The mask pattern image passing through the projection lens 4 is projected on the surface 2a of the wafer 2 via the immersion liquid (pure water) 5. By doing so, a mask pattern is exposed on the surface 2a of the wafer 2. In other words, the surface 2a of the wafer 2 is subjected to exposure treatment.

In the exposure apparatus 1 of this embodiment, the wafer stage 3 has the following surface structure. Specifically, a surface 3b of an outer edge portion 3c of the wafer stage 3 excluding the central wafer placement portion 3a is set (formed) so that a contact angle with the pure water 5 intermittently becomes small as it gradually separates from the wafer placement portion 3a. In other words, the surface 3b is an area adjacent to an outer edge portion (outer peripheral portion) 2b of the wafer placed on the wafer stage 3, that is, an outer edge portion thereof. The surface 3b is set (formed) so that a contact angle with the pure water 5 intermittently becomes small from the inside, that is, wafer placement portion 3a (outer edge portion 2b of the wafer 2) toward the outside. Specifically, in the surface 3b of the wafer stage 3, a contact angle of the surface 3b with the pure water 5 supplied onto there is set to about 70°. The surface 3b is the innermost side of the outer edge portion 3c of the wafer stage 3, that is, an area in the vicinity of the outer edge portion of the wafer placement portion 3a. The contact angle of the surface 3b of the wafer stage 3 with the pure water 5 is set to become small gradually from about 70° from the vicinity of the outer edge portion of the wafer placement portion 3a toward the outer edge of the wafer stage 3. Specifically, the contact angle of the surface 3b with the pure water 5 is set to about 50° inside a liquid recovery mechanism (liquid drain mechanism) (not shown) provided on the surface (surface layer) 3b of the wafer stage 3.

In the exposure apparatus 1 of this embodiment, the surface 3b of the outer edge portion 3c of the wafer stage 3 has the following surface state. That is, surface tension of the pure water 5 supplied onto the surface 3b of the outer edge portion 3c is set so that it intermittently becomes small from the innermost wafer placement portion 3a toward the outside. In other words, in the exposure apparatus 1, water repellency to the pure water 5 supplied onto the surface 3b of the outer edge portion 3c is set so that it intermittently becomes small from the innermost wafer placement portion 3a toward the outside. Or, in the exposure apparatus 1, hydrophilicity to the pure water 5 supplied onto the surface 3b of the outer edge portion 3c is set so that it intermittently becomes small from the innermost wafer placement portion 3a toward the outside. Unnecessary pure water 5 on the surface 3b of the wafer stage 3 is removed from between the wafer stage 3 and the projection lens 4 by the foregoing liquid drain unit 6b. Thereafter, the unnecessary pure water 5 is drained outside the wafer stage 3 via the liquid recovery mechanism (liquid drain mechanism).

A semiconductor substrate (wafer) 2 according to the first embodiment will be explained below with reference to FIG. 2. FIG. 2 is an enlarged cross-sectional view showing the wafer 2 shown in FIG. 2 to accurately explain the structure.

First, the surface 2a of the wafer 2 is provided with an anti-reflection layer 9 using a coating process. The anti-reflection layer 9 functions as a layer for adjusting a phase of multiple reflection of exposure light (not shown) used for exposure treatment. A resist layer 10 formed with a mask pattern to be exposed and transferred is provided on the anti-reflection layer 9 using a coating process. Thereafter, the wafer 2 is subjected to the following treatment before it is exposed. Specifically, a contact angle of at least outer edge portion 2b of the surface 2a of the wafer 2 with the pure water 5 is set larger than that of the surface 3b of the outer edge portion 3c of the wafer stage 3 with the pure water 5. In this embodiment, the resist layer 10 is formed on the surface 2a of the wafer 2, and thereafter, a top coat layer 11 is formed to cover the resist layer 10. The top coat layer 11 contacts with the pure water 5 at an angle larger than the contact angle of the outer edge portion 3c of the wafer stage 3 with the pure water 5. Specifically, the top coat layer 11 is formed on the surface 2a of the wafer 2 to cover anti-reflection layer 9, resist layer 10 and outer edge portion (outer peripheral portion) 2b of the wafer 2 using a coating process. In the first embodiment, the top coat layer 11 having a contact angle to the pure water 5 set to about 80° is used. The process described so far is carried out, and thereby, the wafer 2 according to the first embodiment is obtained as shown in FIG. 2.

In the following description, the wafer 2 formed with the foregoing anti-reflection layer 9, resist layer 10 top coat layer 11 in addition to the wafer itself is given as the wafer 2. The contact angle to the pure water 5 is defined as follows in a state that the pure water 5 contacts with other substance. The contact angle denotes an angle measured from the inside of the pure water 5 in an angle from the tangential direction of the surface of the pure water 5 to the surface of other substance in a contact point of the surface of the pure water 5 with that of other substance. For example, a contact angle of the pure water 5 with the top coat layer 10 implies angles shown by θ1 and θ2 of FIG. 2. This definition is applied to other contact angles including the foregoing contact angle of the surface 3b of the wafer stage 3 with the pure water 5.

An immersion exposure method according to the first embodiment will be explained below with reference to FIG. 1 to FIG. 3. According to the immersion exposure method, exposure work is carried out using the foregoing immersion scan exposure apparatus 1 and wafer 2.

As shown in FIG. 1, the wafer 2 formed with the foregoing anti-reflection layer 9, resist layer 10 top coat layer 11 is carried on the wafer stage 3 of the immersion scan exposure apparatus 1. The wafer 2 is placed on the wafer placement portion 3a of the wafer stage 3 so that these layers 9, 10 and 11 are positioned facing the projection lens 4. Thereafter, the liquid supply unit 6a supplies the pure water 5 between the projection lens 4 and the surface 2a of the wafer 2. Simultaneously, a mask pattern (semiconductor device pattern) (not shown) formed on the reticle 7 is exposed and projected on the surface of the resist layer 10, and then, transferred to form a latent image thereon. In other words, immersion exposure is started. Incidentally, it is preferable to confirm the following requirement before the immersion exposure is carried out. That is, it is confirmed whether or not the top coat layer 11 having an about 80° contact angle with pure water 5 properly covers the outer peripheral portion (outer edge portion) 2b of the wafer 2.

The foregoing confirming work is preferably done in the following manner. Specifically, a worker observes the outer edge portion 2b of the wafer 2 from the direction parallel to the surface 2a of the wafer 2, that is, from one side of the surface 2a of the wafer 2. It is determined whether or not the edge portion of the top coat layer 11 is placed onto a desired position via the preceding observation. In other words, it is determined whether or not the edge portion of the top coat layer 11 properly covers the edge portion 2b of the wafer 2. If the edge portion of the top coat layer 11 properly covers the edge portion 2b of the wafer 2, the exposure treatment is carried out. On the other hand, if the edge portion of the top coat layer 11 does not properly cover the edge portion 2b of the wafer 2, it is preferable to carry out no exposure treatment. In this case, the wafer 2 is replaced with a new wafer 2 whose edge portion 2b is properly covered by the edge portion of the top coat layer 11, and thereafter, exposure treatment is carried out.

As described above, the edge portion 2b of the wafer 2 is observed according to a proper method before exposure treatment, and thereafter, it is determined whether or not the wafer 2 may be exposed. By doing so, it is possible to prevent the surface 2a of the wafer 2 and the surface 3b of the wafer stage (exposure stage) 3 from being contaminated. Conversely, if the wafer 2 having the edge portion of the top coat layer 11, which is not properly positioned, is subjected to immersion exposure, the pure water 5 is supplied into the backside of the wafer 2. As a result, the wafer 2 is contaminated. It is not necessary to observe the edge portion 2 of the wafer from one side of the surface 2a of the wafer 2. For example, even if the surface 2a of the wafer 2 may be observed from obliquely above and below, the edge portion 2b of the wafer 2 is properly observed. Moreover, the edge portion 2b of the wafer 2 is observed from on side thereof, thereby serving to three-dimensionally image a coated state of the top coat layer 11 to the edge portion 2b of the wafer 2. Therefore, determination is more accurately given.

Immersion exposure to the outer peripheral portion (outer edge portion) 2b of the wafer 2 will be explained below with reference to FIG. 3. In order to expose the outer peripheral portion 2b of the wafer 2, the projection lens 4 is moved above the outer peripheral portion 2b of the wafer 2. Then, the liquid supply unit 6a supplies the pure water 5 between surfaces 2a and 3b of the outer peripheral portion 2b of the wafer 2 and the outer edge portion 3c of the wafer stage (exposure stage) 3 and the projection lens 4. Thereafter, immersion exposure is started with respect to the outer peripheral portion 2b of the wafer 2.

As described in the foregoing related art, impurity (dust) 12 exists on the outer edge portion 3c of the exposure stage 3, and the dust 12 is covered with pure water 5. In such a case, the following possibility becomes high in immersion exposure method and apparatus according to the related art. That is, the dust 12 moves onto the wafer 2 from the outer edge portion 3c of the exposure stage 3 because it goes with a flow of the pure water 5 moving from on the outer edge portion 3c of the exposure stage 3 toward the wafer 2. The dust 12 is moved as described above, and thereby, the surface 2a of the wafer 2 is contaminated. For this reason, when exposing or forming a pattern, a possibility that defect occurs in the pattern becomes extremely high. As a result, performance, quality and reliability of semiconductor devices are reduced, and thus, a rate of manufacturing defective products increases. This is a factor of reducing the yield in the manufacturing process of semiconductor devices.

On the contrary, in the immersion exposure method and immersion scan exposure apparatus 1 according to the first embodiment, the wafer 2 having the following structure is used. That is, the surface 2a of the wafer 2 is covered with the top coat layer 11 having a contact angle with pure water 5 larger than that of the outer edge portion 3c of the exposure stage 3 with pure water 5. By doing so, the dust 12 is not moved onto the surface 2a of the wafer 2 going with a flow of the pure water 5 even if the dust 12 exists on the outer edge portion 3c of the exposure stage 3 and is covered with the pure water 5. In other words, there is almost no possibility that the surface 2a of the wafer 2 is contaminated due to the dust 12 existing on the exposure stage 3. Therefore, there is no possibility that defect occurs in the pattern transferred to the resist layer 10. Although no illustration is given, the exposure apparatus 1 of the first embodiment is provided with a cleaning mechanism functioning as a substrate support member cleaning mechanism. The cleaning mechanism cleans the surface layer 3a of the exposure stage 3, that is, outer edge portion 3c of the exposure stage 3, which is an area adjacent to the outer edge portion 2b of the wafer 2 placed on the exposure stage 3. The cleaning mechanism is provided, and thereby, the dust 12 existing on the outer edge portion 3c of the exposure stage 3 is removed from there without being moved onto the surface 2a of the wafer 2 with a flow of the pure water 5.

As seen from FIG. 3, the outer edge portion 3c of the exposure stage 3 is formed with a drain 13 functioning as a liquid recovery mechanism (liquid drain mechanism) in the immersion scan exposure apparatus 1. Unnecessary pure water 5 on the surface 3b of the exposure stage 3 is removed from between the exposure stage 3 and the projection lens 4 via the liquid drain unit 6b while being drained outside the exposure stage 3 via the drain 13. Although no illustration is given, the immersion scan exposure apparatus 1 is provided with devices for measuring positional precision of the exposure stage and various wirings. The foregoing devices and structures have a need to avoid contacting with the pure water 5. Therefore, these devices and structure are arranged outside the drain 13 so that they are not exposed to the pure water 5.

According to the immersion exposure method according to the first embodiment, the wafer 2 is formed with a pattern using the immersion scan exposure apparatus 1. Then, the wafer 2 is processed via various processes such as etching, and thereafter, used as one of principal components of a semiconductor device (not shown).

As described above, according to the first embodiment, the contact angle of the surface 3b of the outer edge portion 3c of the exposure stage 3 to the immersion liquid 5 is set smaller than that of the surface 2a of the wafer 2 to the immersion liquid 5. Thus, when exposing the outer peripheral portion 2b of the wafer 2, the following advantage is obtained. That is, the immersion liquid 5 existing below the projection lens 4 does not move from the outer edge portion 3c of the exposure stage 3 to the outer peripheral portion 2b of the wafer 2 even if the following cases are given. One is the case where the projection lens 4 is positioned both on the outer edge portion 3c of the exposure stage 3 and on the outer peripheral portion 2b of the wafer 2. Another is the case where the projection lens 4 is positioned on the outer peripheral portion 2b of the wafer 2. In other words, when exposing the outer peripheral portion 2b of the wafer 2, the immersion liquid 5 existing below the projection lens 4 is left on the outer edge portion 3c of the exposure stage 3. Thus, the impurity 12 covered with the immersion liquid 5 below the projection lens 4 does not move from the outer edge portion 3c of the exposure stage 3 to the outer peripheral portion 2b of the wafer 2. As a result, the wafer 2 has almost no possibility of being contaminated by the impurity 12. In addition, there is no possibility that defect occurs in the pattern transferred to the resist layer 10. Moreover, it is possible to reduce a rate of manufacturing defective products resulting from the reduction in performance, quality and reliability of semiconductor devices. Therefore, this is a factor of enhancing the yield in the manufacturing process of semiconductor devices.

According to the first embodiment, the substrate 2 to be processed is prevented from being contaminated in the immersion exposure method and the immersion exposure apparatus 1. Moreover, there is no possibility of reducing pattern exposure accuracy. Simultaneously, the immersion exposure method of preventing the reduction of pattern exposure accuracy is employed. This serves to prevent reduction of the yield in the manufacturing process of semiconductor devices; therefore, semiconductor devices are effectively manufactured.

In the first embodiment, the pure water 5 is used as the immersion liquid; however, the present invention is not limited to the pure water. For example, liquid containing ionized water, organic matter and silicon compound may be used as the immersion liquid 5. In this case, the same settings as the this embodiment are given in the relationship of the contact angle to the immersion liquid 5 between the wafer 2 and the outer edge portion 3c of the wafer stage 3 is By doing so, the same effect as the first embodiment is obtained.

Second Embodiment

A second embodiment of the present invention will be explained below with reference to FIG. 1 to FIG. 3 like the first embodiment. The same reference numerals are used to designate portion identical to the first embodiment, and the details are omitted.

According to the second embodiment, a method different from the first embodiment is employed to make large a contact angle of the outer edge portion (outer peripheral portion) 2b of the wafer 2 with the immersion liquid 5. In this case, the immersion exposure apparatus 1 of the first embodiment is used as an immersion exposure apparatus; therefore, the explanation is omitted.

According to the second embodiment, as depicted in FIG. 2, anti-reflection layer 9 and resist layer 10 are formed on the surface 2a of the wafer 2 using the same method as the first embodiment. Thereafter, the top coat layer 11 is provided on the surface 2a of the wafer 2 to cover the foregoing anti-reflection layer 9 and resist layer 10 and the outer edge portion (outer peripheral portion) 2b of the wafer 2. However, in this state, a contact angle of the top coat layer 11 to pure water (immersion liquid) 5 is set to about 70°. In other words, the contact angle is set about 10° smaller than the contact angle of the first embodiment.

Treatment for making large the contact angle to the pure water 5 is carried out. According to the second embodiment, water repellent treatment is subjected to the top coat layer 11 formed on the surface 2a of the wafer 2. Specifically, a fluorine gas is blown to the surface of the top coat layer 11 for 30 seconds to absorb the fluorine gas thereon. By doing so, the surface of the top coat layer 11 is subjected to water repellent coating. The water repellent coating is carried out, and thereby, the contact angle of the top coat layer 11 to the pure water 5 is set to about 110°. In other words, the contact angle of the top coat layer 11 to the pure water 5 after the coating becomes about 40° larger than that before the coating. Thereafter, as shown in FIG. 1 and FIG. 3, immersion exposure is started with respect to the wafer 2 using the same process as the first embodiment.

As described above, according to the second embodiment, the same effect as the foregoing first embodiment is obtained. Moreover, water repellent coating (fluorine gas blowing) is carried out with respect to the wafer 2. Thereafter, the contact angle of the top coat layer 11 to the pure water 5 becomes larger than that of the immersion liquid 5 to the outer edge portion 3c of the wafer stage 3 as compared with the first embodiment. Thus, the dust 12 on the outer edge portion 3c of the wafer stage 3 is hard to move onto the surface 2a of the wafer 2. In other words, the surface 2a of the wafer 2 is hard to receive an influence by the dust 12 on the wafer stage 3; therefore, it is hard to be contaminated. In addition, a possibility that defect occurs in the pattern transferred to the resist layer 10 becomes low. Moreover, it is possible to reduce a rate of manufacturing defective products resulting from the reduction in performance, quality and reliability of semiconductor devices. Therefore, this is a factor of enhancing the yield in the manufacturing process of semiconductor devices.

Third Embodiment

A third embodiment of the present invention will be explained below with reference to FIG. 1 to FIG. 3 like the foregoing first and second embodiments. The same reference numerals are used to designate portion identical to the first and second embodiments, and the details are omitted.

According to the third embodiment, a method different from the first embodiment is employed to make large a contact angle of the outer edge portion (outer peripheral portion) 2b of the wafer 2 with the immersion liquid 5. In this case, the immersion exposure apparatus 1 of the first embodiment is used as an immersion exposure apparatus; therefore, the explanation is omitted.

According to the second embodiment, as depicted in FIG. 2, anti-reflection layer 9 and resist layer 10 are formed on the surface 2a of the wafer 2 using the same method as the first embodiment. Thereafter, the top coat layer 11 is provided on the surface 2a of the wafer 2 to cover the foregoing anti-reflection layer 9 and resist layer 10 and the outer edge portion (outer peripheral portion) 2b of the wafer 2. However, in this state, a contact angle of the top coat layer 11 to the immersion liquid 5 is set to about 95°. In other words, the contact angle is set about 15° larger than the contact angle of the first embodiment.

Treatment for making large the contact angle to the pure water 5 is carried out. According to the third embodiment, treatment for making large the contact angle to the pure water 5 is subjected to the top coat layer 11 formed on the surface 2a of the wafer 2. Specifically, the wafer 2 formed with the top coat layer 11 is received in a processing chamber of an $O^2$ plasma etching system (not shown), and then, exposed in the atmosphere of $O^2$ plasma for three seconds. By doing so, the surface state of the top coat layer 11 is made coarse more than the state before being exposed in the atmosphere of $O^2$ plasma. The foregoing $O^2$ plasma treatment is carried out, and thereby, the contact angle of the top coat layer 11 to the immersion liquid 5 is set to about 105°. In other words, the contact angle of the top coat layer 11 to the immersion liquid 5 after the $O^2$ plasma treatment becomes about 10° larger than that before the $O^2$ plasma treatment. Thereafter, as shown in FIG. 1 and FIG. 3, immersion exposure is started with respect to the wafer 2 using the same process as the first and second embodiments.

As described above, according to the third embodiment, the same effect as the foregoing first and second embodiments is obtained. Specifically, the $O^2$ plasma treatment is carried out with respect to the wafer 2. Thereafter, the contact angle of the top coat layer 11 to the pure water 5 becomes larger than that of the immersion liquid 5 to the outer edge portion 3c of the wafer stage 3 as compared with the first embodiment. Thus, the dust 12 on the outer edge portion 3c of the wafer stage 3 is hard to move onto the surface 2a of the wafer 2. In other words, the surface 2a of the wafer 2 is hard to receive an influence by the dust 12 on the wafer stage 3; therefore, it is hard to be contaminated. In addition, a possibility that defect occurs in the pattern transferred to the resist layer 10 becomes low. Moreover, it is possible to reduce a rate of manufacturing defective products resulting from the reduction in performance, quality and reliability of semiconductor devices. Therefore, this is a factor of enhancing the yield in the manufacturing process of semiconductor devices.

Fourth Embodiment

A fourth embodiment of the present invention will be explained below with reference to FIG. 1 to FIG. 3 like the foregoing first to third embodiments. The same reference numerals are used to designate portion identical to the first to third embodiments, and the details are omitted.

According to the third embodiment, a method different from the first embodiment is employed to make large a contact angle of the outer edge portion (outer peripheral portion) 2b of the wafer 2 with the immersion liquid 5. In this case, the immersion exposure apparatus 1 of the first embodiment is used as an immersion exposure apparatus; therefore, the explanation is omitted.

According to the second embodiment, as depicted in FIG. 2, anti-reflection layer 9 and resist layer 10 are formed on the surface 2a of the wafer 2 using the same method as the first embodiment. Thereafter, the top coat layer 11 is provided on the surface 2a of the wafer 2 to cover the foregoing anti-reflection layer 9 and resist layer 10 and the outer edge portion (outer peripheral portion) 2b of the wafer 2. However, in this state, a contact angle of the top coat layer 11 to the pure water 5 is set to about 95°. In other words, the contact angle is set about 15° larger than the contact angle of the first embodiment.

Treatment for making large the contact angle to the pure water 5 is carried out. According to the fourth embodiment, water repellent treatment is subjected to the top coat layer 11 formed on the surface 2a of the wafer 2. Specifically, although no illustration is given, fine grains of fluorocarbon resin are atomized to the surface of the top coat layer 11. By doing so, the surface of the top coat layer 11 is formed with a water repellent layer coated with fine grains of fluorocarbon resin. Thus, the surface of the top coat layer 11 is subjected to water repellent coating. The water repellent coating is carried out, and thereby, the contact angle of the top coat layer 11 to the pure water 5 is set to about 110°. In other words, the contact angle of the top coat layer 11 to the pure water 5 after the coating becomes about 15° larger than that before the coating. Thereafter, as shown in FIG. 1 and FIG. 3, immersion exposure is started with respect to the wafer 2 using the same process as the first to third embodiments.

As described above, according to the fourth embodiment, the same effect as the foregoing first to third embodiments is obtained. Specifically, the treatment for coating fine grains of fluorocarbon resin (fluorocarbon resin layer coating) is carried out with respect to the wafer 2. Thereafter, the contact angle of the top coat layer 11 to the pure water 5 becomes larger than that of the immersion liquid 5 to the outer edge portion 3c of the wafer stage 3 as compared with the first embodiment. Thus, the dust 12 on the outer edge portion 3c of the wafer stage 3 is hard to move onto the surface 2a of the wafer 2. In other words, the surface 2a of the wafer 2 is hard to receive an influence by the dust 12 on the wafer stage 3; therefore, it is hard to be contaminated. In addition, a possibility that defect occurs in the pattern transferred to the resist layer 10 becomes low. Moreover, it is possible to reduce a rate of manufacturing defective products resulting from the reduction in performance, quality and reliability of semiconductor devices. Therefore, this is a factor of enhancing the yield in the manufacturing process of semiconductor devices.

Fifth Embodiment

A fifth embodiment of the present invention will be explained below with reference to FIG. 1 to FIG. 3 like the foregoing first to fourth embodiments. The same reference numerals are used to designate portion identical to the first to fourth embodiments, and the details are omitted.

According to the fifth embodiment, a method different from the first to fourth embodiments is employed. Namely, a contact angle of the surface 2a of the wafer 2 with the immersion liquid 5 is set to different angle for each area. Specifically, a contact angle of a pattern forming area of the wafer 2, that is the surface 2a of the central portion thereof to the immersion liquid 5 is set relatively smaller than that of the surface 2a of the outer peripheral portion (outer edge portion) 2b of the wafer 2. In this case, the immersion exposure apparatus 1 of the first embodiment is used as an immersion exposure apparatus; therefore, the explanation is omitted.

According to the fifth embodiment, as depicted in FIG. 2, anti-reflection layer 9 and resist layer 10 are formed on the surface 2a of the wafer 2 using the same method as the first embodiment. Thereafter, the top coat layer 11 is provided on the surface 2a of the wafer 2 to cover the foregoing anti-reflection layer 9 and resist layer 10 and the outer edge portion (outer peripheral portion) 2b of the wafer 2. However, in this state, a contact angle of the top coat layer 11 to the immersion liquid 5 is set to the same angle as the first embodiment, that is, about 80°. Moreover, a contact angle of the resist layer 10 to the immersion liquid 5 is set to about 65°.

Thinner is supplied as a top coat layer peel-off agent (top coat layer removal agent) to the center portion of the top coat layer 11 formed on the wafer to cover the foregoing anti-reflection layer 9 and resist layer 10. By doing so, only center portion of the top coat layer 11 is peeled off (removed) from the wafer 2. Therefore, the pattern forming area on the wafer, that is, the surface of the resist layer 10 becomes a state of being exposed to outside. Thereafter, as shown in FIG. 1 and FIG. 3, immersion exposure treatment is started with respect to the wafer using the same process as the first to fourth embodiments.

As described above, according to the fifth embodiment, the same effect as the first embodiment is obtained. Moreover, the pattern forming area on the wafer, that is, the surface of the resist layer 10 is exposed to outside. Thus, the surface 2a of the wafer 2 is hard to receive interference by the top coat layer 11 when exposing the pattern, as compared with the first to fourth embodiments. In other words, the pattern is exposed and transferred to the resist layer 10 with high accuracy. In addition, it is possible to reduce a rate of manufacturing defective products resulting from the reduction in performance, quality and reliability of semiconductor devices. Therefore, this is a factor of enhancing the yield in the manufacturing process of semiconductor devices.

Sixth Embodiment

A sixth embodiment of the present invention will be explained below with reference to FIG. 1 to FIG. 3 like the foregoing first to fifth embodiments. The same reference numerals are used to designate portion identical to the first to fifth embodiments, and the details are omitted.

According to the sixth embodiment, a method different from the first to fourth embodiments is employed, like the fifth embodiment. Namely, a contact angle of the surface 2a of the wafer 2 with the immersion liquid 5 is set to different angle for each area. Specifically, a contact angle of a pattern forming area of the wafer 2, that is the surface 2a of the central portion thereof to the immersion liquid 5 is set relatively smaller than that of the surface 2a of the outer peripheral portion (outer edge portion) 2b of the wafer 2. In this case, the immersion exposure apparatus 1 of the first embodiment is used as an immersion exposure apparatus; therefore, the explanation is omitted.

According to the sixth embodiment, as depicted in FIG. 2, anti-reflection layer 9 and resist layer 10 are formed on the surface 2a of the wafer 2 using the same method as the first embodiment. Thereafter, the top coat layer 11 is provided on the surface 2a of the wafer 2 to cover the foregoing anti-reflection layer 9 and resist layer 10 and the outer edge portion (outer peripheral portion) 2b of the wafer 2. However, in this state, a contact angle of the top coat layer 11 to the immersion liquid 5 is set to the same angle as the first and fifth embodiments, that is, about 80°. Moreover, a contact angle of the resist layer 10 to the immersion liquid 5 is set to the same angle as the fifth embodiment, that is, about 65°.

Treatment for making small the contact angle to the immersion liquid 5 is carried out with respect to the wafer 2. According to the sixth embodiment, hydrophilic treatment is carried out with respect to the center of the top coat layer 11 formed on the surface 2a of the wafer 2. Specifically, ozone is atomized to a pattern forming area on the wafer 2, that is, the center surface of the top coat layer 11, although no illustration is given. By doing so, the contact angle of the center surface of the top coat layer 11 to the immersion liquid 5 is made small.

The ozone atomizing treatment is carried out, and thereby, the contact angle of the center surface of the top coat layer 11 to the immersion liquid 5 is set to about 50°. In other words, the contact angle of the center surface of the top coat layer 11 to the immersion liquid 5 after ozone atomizing treatment is about 30° smaller than the contact angle before the same treatment. Thereafter, as shown in FIG. 1 and FIG. 3, immersion exposure treatment is started with respect to the wafer using the same process as the first to fifth embodiments.

As described above, according to the sixth embodiment, the same effect as the foregoing first and fifth embodiments is obtained. Moreover, the contact angle of the pattern forming area, that is, the center surface of the top coat layer 11 to the immersion liquid 5 is made smaller than the first to fourth embodiments. However, in the surface of the top coat layer 11, the contact angle of the surface of the edge portion of the top coat layer 11 excluding the center thereof is the same as the first to fourth embodiments. Therefore, there is almost no possibility that the wafer 2 is contaminated by impurity 12. In addition, it is possible to reduce a rate of manufacturing defective products resulting from the reduction in performance, quality and reliability of semiconductor devices. Therefore, this is a factor of enhancing the yield in the manufacturing process of semiconductor devices. Incidentally, even if ozone water, oxygen or materials such as acidic water having oxidization action may be used in place of ozone, the same effect as this embodiment is obtained.

Seventh Embodiment

Figure 5:
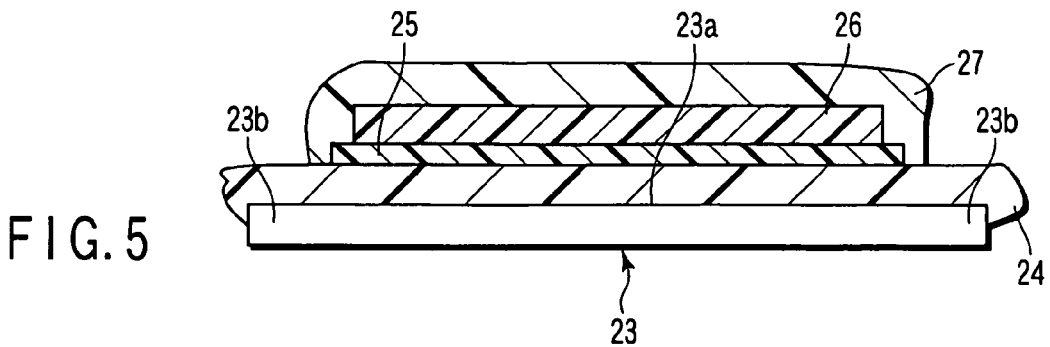
FIG. 5 is a cross-sectional view schematically showing the structure of a semiconductor substrate according to a seventh embodiment.
Figure 4:
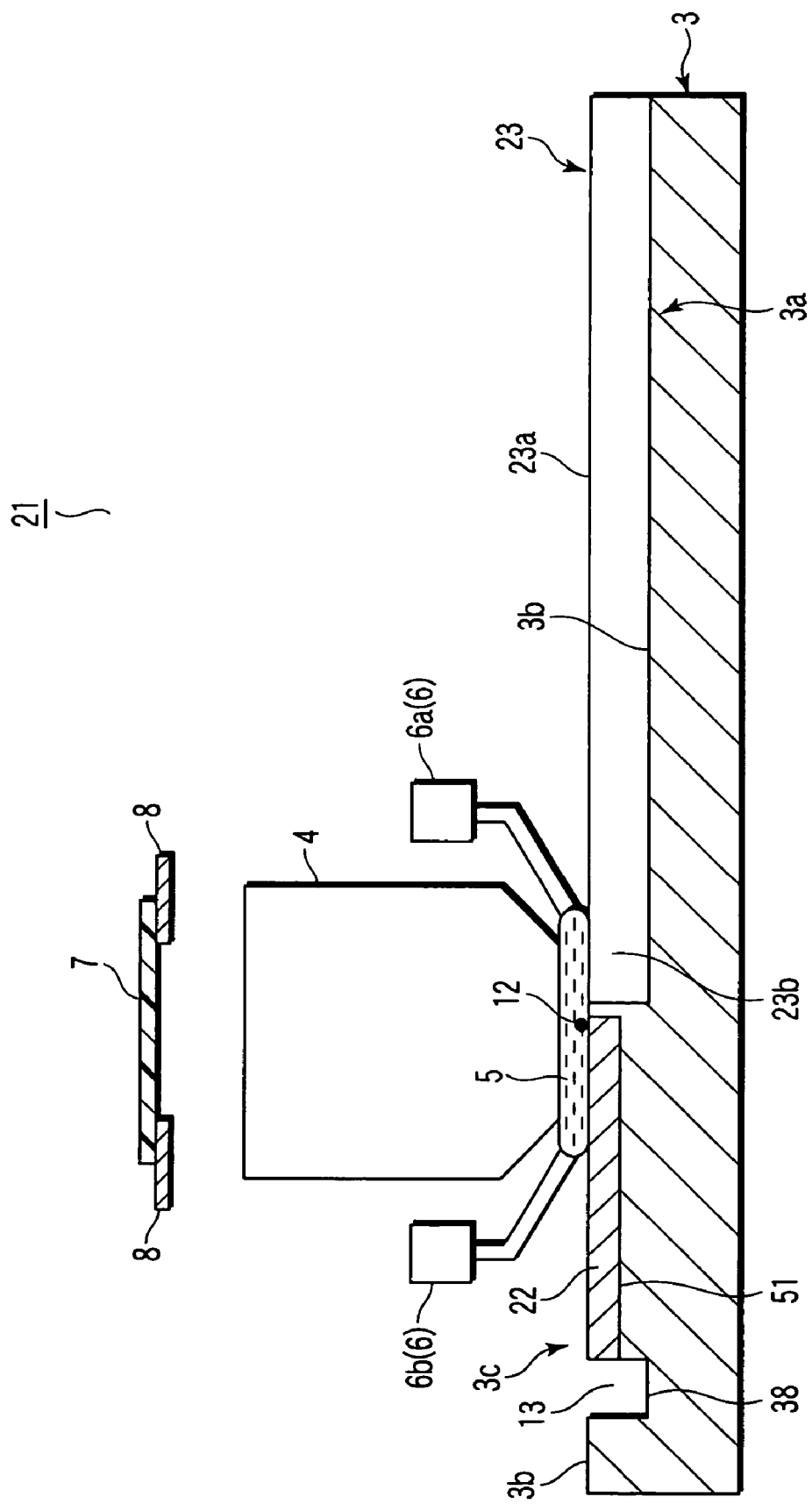
FIG. 4 is a cross-sectional view to schematically showing immersion exposure method and apparatus according to a seventh embodiment.

A seventh embodiment of the present invention will be explained below with reference to FIG. 4 and FIG. 5. FIG. 4 is a cross-sectional view to schematically showing immersion exposure method and apparatus according to a seventh embodiment. FIG. 5 is a cross-sectional view schematically showing the structure of a semiconductor substrate according to a seventh embodiment. The same reference numerals are used to designate portion identical to the first to sixth embodiments, and the details are omitted.

According to the seventh embodiment, treatment for making small a contact angle is realized using a method different from the foregoing first to sixth embodiments. Specifically, a contact angle of the outer edge portion 3c of the wafer stage 3 to the immersion liquid 5 is set smaller than that of an outer peripheral portion 23b of a wafer 23.

An immersion exposure apparatus 21 according to the seventh embodiment will be explained below with reference to FIG. 4. As show in FIG. 4, the immersion exposure apparatus 21 is an immersion scan exposure apparatus like the immersion exposure apparatus described in the first embodiment. The immersion exposure apparatus 21 has the same structure and configuration as the immersion exposure apparatus 1. However, the immersion exposure apparatus 21 is provided with an auxiliary member 22 on the surface layer 3b of the wafer stage 3. Specifically, the auxiliary member 22 is provided on the surface layer of the outer edge portion 3c of the wafer stage 3, which is adjacent to an outer peripheral portion 23b of the wafer 23 placed on the wafer stage. The auxiliary member 22 has the surface given below. Namely, a contact angle with the immersion liquid 5 continuously or intermittently becomes small from the outer peripheral portion 23b of the wafer 23 toward outside. Moreover, a liquid recovery mechanism 13 for recovering the immersion liquid 5 is provided outside the area of the auxiliary member 22. Specifically, an auxiliary plate 22 is buried in the surface layer of the outer edge portion 3c of the wafer stage 3. The auxiliary plate 22 is used, and thereby, the contact angle of the outer edge portion 3c of the wafer stage 3 to the immersion liquid 5 is set smaller than that of the outer peripheral portion 23b of a wafer 23. The auxiliary plate 22 has a surface in which a contact angle with immersion liquid (contact water) 5 is set to about 65°. The surface layer of the outer edge portion 3c of the wafer stage 3 is formed with a drain 13 outside the auxiliary member 22.

A semiconductor substrate (wafer) 23 according to the seventh embodiment will be explained below with reference to FIG. 5. FIG. 5 is an enlarged cross-sectional view showing the wafer 23 to accurately explain the structure.

First, a transfer layer coating material is dropped on a surface 23a of the wafer 23, and then, spread by rotation via spin coating. Thereafter, the transfer layer coating material is heated. By doing so, the surface 23a of the wafer 23 is formed with a reflection absorption layer 24 having a thickness of about 300 nm. In this case, the reflection absorption layer 24 is formed so that the outer edge portion (outer peripheral portion) 23b of the wafer 23 is covered with the edge portion of the reflection absorption layer 24 functioning as the transfer layer. The reflection absorption layer 24 is set to contact with pure water 5 used as immersion liquid at a first angle. Specifically, the reflection absorption layer 24 is set to contact with the pure water 5 at an angle of about 80°. In addition, the reflection absorption layer 24 functions as a transfer layer in pattern transfer.

Next, a spin on glass (SOG) material is dropped on the reflection absorption layer 24, and then, spread by rotation via spin coating. The spin on glass (SOG) material has two functions, that is, a function of adjusting a phase of multiple reflections of exposure light and a transfer function. Thereafter, the SOG material is heated. By doing so, the surface of the reflection absorption layer 24 is formed with a SOG layer 25 functioning as an anti-reflection layer having a thickness of about 50 nm. In this case, the SOG layer 25 is formed in a state of being removed by the width of about 5 mm from the outer edge (peripheral) portion of the wafer 23 toward inside, using thinner. In other words, the SOG layer 25 is formed inside the surface on the wafer 23 facing the projection lens 4.

The surface of the SOG layer 25 is further provided with an ArF chemically amplified resist layer 26, which contains a material of generating acid and has a thickness of about 200 nm. The chemically amplified resist layer 26 is formed in the following manner. Specifically, a chemically amplified resist coating material is dropped on the anti-reflection layer 25, and then, spread by rotation via spin coating. Thereafter, the chemically amplified resist coating material is heated to remove solvent contained the material. The ArF chemically amplified resist layer 26 is formed in a state of being removed by the width of about 7 mm from the outer edge (peripheral) portion of the wafer 23 toward inside, using thinner. In other words, the ArF chemically amplified resist layer 26 is formed inside the surface on the SOG layer 25 facing the projection lens 4.

A top coat layer material is further dropped on the ArF chemically amplified resist layer 26, and then, spread by rotation via spin coating. Thereafter, the top coat layer material is heated to cover the foregoing ArF chemically amplified resist layer 26 and SOG layer 25. By doing so, a top coat layer 27 having a thickness of 30 nm is formed on the reflection absorption layer 24. The top coat layer 27 is formed in a state of being removed by the width of about 3 mm from the outer edge (peripheral) portion of the wafer 23 toward inside, using thinner. In other words, the top coat layer 27 is formed inside the surface on the reflection absorption layer 24 facing the projection lens 4 to cover the foregoing ArF chemically amplified resist layer 26 and SOG layer 25. Moreover, the top coat layer 27 is set to contact with pure water (immersion liquid) 5 at a second angle. Specifically, the top coat layer 27 is set to contact with the pure water 5 at an angle of about 70°.

The process described so far is carried out, and thereby, the wafer 23 of the seventh embodiment is obtained as seen from FIG. 5. In other words, the wafer 23 has the structure, which is formed with four layers, that is, reflection absorption layer 24, SOG layer 25, ArF chemically amplified resist layer 26 and top coat layer 27 on the wafer 23. Of the foregoing layers 24 to 27, only two, that is, reflection absorption layer 24 and top coat layer 27 are exposed on the wafer 23. The reflection absorption layer 24 is exposed on the wafer 23 by a width of about 3 mm from the outer edge (peripheral) portion of the wafer 23, and set to contact with the pure water (immersion liquid) 5 at the first angle of about 80°. The center portion of the wafer 23 is covered with the top coat layer 27. The top coat layer 27 is set to contact with the pure water (immersion liquid) 5 at the second angle of about 70°.

The wafer 23 of the seventh embodiment is formed having the same contact angle as the foregoing fifth and sixth embodiments. Namely, the contact angle of pattern forming area, that is, the center surface of the wafer 23 to the immersion liquid 5 is set smaller than that of the surface of the outer peripheral portion 23b of the wafer 23 excluding the center portion of the wafer 23.

Like the first embodiment, it is preferable to confirm the following condition before immersion exposure is carried out with respect to the wafer 23. Namely, it is confirmed whether or not the reflection absorption layer 24 having the contact angle of about 80° with pure water 5 properly covers the outer peripheral portion 23b of the wafer 23.

Preferably, the confirmation work is carried out in the following manner. Specifically, the outer peripheral portion (edge portion) 23b of the wafer 23 is observed from a direction parallel with the surface 23a of the wafer 23, that is, from one side thereof. Via the foregoing observation, it is determined whether or not the edge portion of the reflection absorption layer 24 is formed at a desired position. In other words, it is determined whether or not the edge portion of the reflection absorption layer 24 properly covers the edge portion 23b of the wafer 23. If the edge portion of the reflection absorption layer 24 properly covers the edge portion 23b of the wafer 23, exposure is intactly carried out. On the other hand, if the edge portion of the reflection absorption layer 24 does not properly cover the edge portion 23b of the wafer 23, it is preferable to carry out no exposure. In this case, the wafer 23 is replaced with a new wafer whose edge portion is properly covered with the edge portion of the reflection absorption layer 24, and thereafter, exposure is carried out.

As described above, the edge portion 23b of the wafer 23 is observed via the foregoing proper method before being exposure, and thereafter, it is determined whether or not exposure should be carried out. By doing so, it is possible to prevent the surface 23a of the wafer 23 and the surface 3b of the wafer stage (exposure stage) 3 from being contaminated. Conversely, if the wafer 23 having the edge portion of the reflection absorption layer 24, which is not properly positioned, is subjected to immersion exposure, the pure water 5 is supplied into the backside of the wafer 23. As a result, the wafer 23 is contaminated. It is not necessary to observe the edge portion 23b of the wafer from one side of the surface 23a of the wafer 23. For example, even if the surface 23a of the wafer 23 may be observed from obliquely above and below, the edge portion 23b of the wafer 23 is properly observed. Moreover, the edge portion 23b of the wafer 23 is observed from on side thereof, thereby serving to three-dimensionally image a coated state of the reflection absorption layer 24 to the edge portion 23b of the wafer 23. Therefore, determination is more accurately given.

An immersion exposure method according to the seventh embodiment will be explained below with reference to FIG. 4 and FIG. 5. According to the immersion exposure method, exposure is carried out using the foregoing immersion scan exposure apparatus 21 and wafer 23.

As shown in FIG. 4, the wafer 22 formed with the foregoing reflection absorption layer 24, SOG layer 25, ArF chemically amplified resist layer 26 and top coat layer 27 is carried on the wafer stage 3 of the immersion scan exposure apparatus 21. The wafer 23 is placed on the wafer placement portion 3a of the wafer stage 3 so that these layers 24, 25, 26 and 26 are positioned facing the projection lens 4. Thereafter, the liquid supply unit 6a supplies the pure water 5 between the projection lens 4 and the surface 23a of the wafer 23. Simultaneously, a mask pattern (semiconductor device pattern) (not shown) formed on the reticle 7 is exposed and projected on the surface of the resist layer 26, and then transferred to form a latent image thereon. In other words, immersion exposure is started. Incidentally, the word for confirming the following requirement before the immersion exposure is properly completed. That is, it is confirmed whether or not the top coat layer 27 properly covers the outer peripheral portion (outer edge portion) 23b of the wafer 23. Namely, it has been already confirmed that the outer peripheral portion 23b of the wafer 23 is properly covered with the top coat layer 27.

Exposure is carried out while the projection optical system 4 such as projection lens moves from the center portion of the wafer 23 toward the outer peripheral portion 23b thereof. When the projection lens 4 is moved above the outer peripheral portion 23b of the wafer 23, the liquid supply unit 6a supplies pure water 5 to the following portions. Specifically, the portions are the surface 23a of the outer peripheral portion 23b of the wafer 23, the surface 2b of the outer edge portion 3c of the wafer stage (exposure stage) 3 and between the auxiliary plate 22 and the projection lens 4. Thereafter, immersion exposure is started with respect to the outer peripheral portion 23b of the wafer 23.

According to the seventh embodiment, in the immersion exposure method and the immersion scan exposure apparatus 21, the wafer 23 having the structure is used like the method and the apparatus 1 according to the foregoing first embodiment. Specifically, the wafer 23 has the surface 23a, which is covered with the top coat layer 27 having a contact angle larger to the pure water 5 than that of the auxiliary plate 22 provided on the outer edge portion 3c of the exposure stage 3. By doing so, dust 12 is not moved onto the surface 23a of the wafer 23 with a flow of the pure water 5 even if the following condition is given. Namely, the condition is that the dust 12 exists on the auxiliary plate 22 provided on the outer edge portion 3c of the exposure stage 3 and is covered with the pure water 5. In other words, the surface 23a of the wafer 23 is not contaminated due to the dust 12 existing on the exposure stage 2. Thus, there is almost no possibility that defect occurs in a pattern transferred onto the resist layer 26. Therefore, according to the seventh embodiment, the dust 12 existing on the auxiliary plate 22 provided on the outer edge portion 3c of the exposure stage 3 is not moved onto the surface 23a of the wafer 23 with a flow of the pure water 5. Moreover, the dust 12 is removed from the outer edge portion 3c of the exposure stage 3 by a cleaning mechanism (not shown) for cleaning the outer edge portion 3c of the exposure stage 3.

As seen from FIG. 4, the outer edge portion 3c of the exposure stage 3 is formed with a drain 13 functioning as a liquid recovery mechanism (liquid drain mechanism) in the immersion scan exposure apparatus 21. Unnecessary pure water 5 on the surface 3b of the exposure stage 3 is removed from between the exposure stage 3 and the projection lens 4 via the liquid drain unit 6b while being drained outside the exposure stage 3 via the drain 13. Although no illustration is given, the immersion scan exposure apparatus 1 is provided with devices for measuring positional precision of the exposure stage and various wirings. The foregoing devices and structures have a need to avoid contacting with the pure water 5. Therefore, these devices and structure are arranged outside the drain 13 so that they are not exposed to the pure water 5.

Thereafter, the following predetermined processes are carried out, and thereby, the surface 23a of the wafer 23 is not contaminated by dust 12, and a resist pattern having no defect is formed. One is a post exposure bake (PEB) process, and another is a process of removing (peeling) the top coat layer. Another is a process of developing the pattern transferred to the resist layer 26. Thus, according to the immersion exposure method of the seventh embodiment, the wafer 23 formed with a proper pattern is obtained using the immersion scan exposure apparatus 21. Then, the wafer 23 is processed (etched) into a desired state via various processes such as etching, and thereafter, used as one of principal components of a semiconductor device (not shown).

As described above, according to the seventh embodiment, the same effect as the foregoing first to sixth embodiments is obtained. Moreover, SOG layer 25, ArF chemically amplified resist layer 26 and top coat layer 27 are interposed between the wafer 23 and the reflection absorption layer 24. By doing so, pattern exposure is carried out with high accuracy. In addition, the immersion scan exposure apparatus 21 of the seventh embodiment is provided with the auxiliary plate 22. Specifically, of the surface layer 3b of the wafer stage 3, an area adjacent to the outer peripheral portion 23b of the wafer 23, that is, the surface layer of the edge portion 3c of the wafer stage 3, is provided with the auxiliary plate 22 having the following surface. Namely, the auxiliary plate 22 has the surface having the contact angle to the immersion liquid 5 continuously or intermittently becomes small from the outer peripheral portion 23b of the wafer 23 toward outside. By doing so, it is possible to extremely reduce a possibility that the surface 23a of the wafer 23 is contaminated by dust 12.

Therefore, according to the seventh embodiment, a possibility that defect occurs in the pattern transferred to the resist layer 26 becomes very low. Moreover, it is possible to reduce a rate of manufacturing defective products resulting from the reduction in performance, quality and reliability of semiconductor devices. Therefore, this is a factor of enhancing the yield in the manufacturing process of semiconductor devices.

The foregoing exposure method, exposure apparatus and method of manufacturing a semiconductor device according to the present invention is not limited to the first to seventh embodiments. These configurations or part of manufacturing process are variously changed within the scope without departing from the subject matter of the invention. Moreover, various settings may be properly combined and carried out.

For example, the process of forming a resist pattern is not limited to the foregoing method. Moreover, in the process of removing (peeling) the top coat layer, the top coat layer may be removed using alkali development liquid simultaneously in the development process.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An immersion exposure method of carrying out an exposure process in a state that liquid is at least partly filled between a substrate to be exposed and a projection optical system of an exposure apparatus to carry out the exposure process, comprising:
   carrying out a process of making a large contact angle between the liquid and at least an outer peripheral portion of a main surface of the substrate when compared with a contact angle between the liquid and an area adjacent to the outer peripheral portion of the substrate, the area being a part of a surface of a substrate supporting side of a substrate support member to support the substrate included in the exposure apparatus; and
   carrying out the exposure process.

2. The method according to claim 1, further comprising:
   providing a layer contacting with the liquid on the main surface at an angle larger than the contact angle of the liquid at the area of the substrate support member, the layer covering a resist layer during the process of making the large contact angle after providing the resist layer on the main surface of the substrate.

3. The method according to claim 2, further comprising:
   carrying out an $O^2$ plasma treatment with respect to the layer contacting with the liquid at an angle larger than the contact angle of the liquid at the area of the substrate support member before carrying out the exposure process.

4. The method according to claim 1, further comprising:
   carrying out a water repellent treatment to the main surface of the substrate during the process of making the large contact angle.

5. The method according to claim 4, further comprising:
   blowing fluorocarbon gas to the main surface of the substrate as the water repellent treatment.

6. The method according to claim 1, wherein the liquid is any liquid containing pure water, ionized water, organic matter, and liquid containing a silicon compound.

7. The method according to claim 1, further comprising:
   carrying out a hydrophilic treatment for atomizing ozone with respect to the main surface of the substrate.

8. An immersion exposure method of carrying out an exposure process in a state that liquid is at least partly filled between a substrate to be exposed and a projection optical system of an exposure apparatus to carry out the exposure process, comprising:
   providing an absorption layer contacting with the liquid at a first angle on a main surface of a side to be exposed of the substrate;
   providing a resist layer on the absorption layer and on a surface facing the projection optical system;
   providing a top coat layer contacting with the liquid at a second angle and covering the resist layer, the top coat layer being provided on the surface facing the projection optical system;
   supporting the substrate provided with the absorption layer, the resist layer, and the top coat layer by a substrate support member included in the exposure apparatus, and providing an auxiliary member contacting with the liquid at an angle smaller than the first angle at an area adjacent to the outer peripheral portion of the substrate, the area being a part of a surface layer of the substrate supporting side of the substrate support member;
   carrying out the exposure process with respect to the substrate; and
   developing a pattern exposed to the resist layer by the exposure process.

9. The method according to claim 8, further comprising:
   providing a layer for adjusting a phase of multiple reflection of exposure light used for the exposure process between the absorption layer and the resist layer.

10. The method according to claim 8, wherein the liquid is any liquid containing pure water, ionized water, organic matter, and liquid containing a silicon compound.

11. The apparatus according to claim 8, wherein the liquid is any liquid containing pure water, ionized water, organic matter, and liquid containing a silicon compound.

12. An immersion exposure apparatus, comprising:
    a substrate support member to support a substrate which is exposed to a pattern by an exposure process; and
    a projection optical system to project the pattern to the substrate,
    wherein the apparatus is configured to carry out the exposure process after carrying out a process of making a large contact angle between the liquid and at least an outer peripheral portion of a main surface of the substrate when compared with a contact angle between the liquid and an area adjacent to the outer peripheral portion of the substrate, the area being a part of a surface of a substrate supporting side of a substrate support member to support the substrate included in the exposure apparatus; and
    the apparatus carrying out the exposure process in a state that liquid is at least partly filled between the substrate and the projection optical system, and a surface outside the outer peripheral portion of the substrate supported by the substrate support member, the surface being a part of a surface of a substrate supporting side of the substrate support member, is set to a state that a contact angle of the liquid becomes small continuously or intermittently from the outer peripheral portion of the substrate toward the surface outside the outer peripheral portion.

13. The apparatus according to claim 12, further comprising:
    an auxiliary member provided at an area adjacent to the outer peripheral portion of the substrate supported by the substrate support member, the area being a part of a surface layer of the substrate supporting side of the substrate support member, the auxiliary member having a surface set to the state that the contact angle of the liquid becomes small continuously or intermittently from the outer peripheral portion of the substrate toward the surface outside the outer peripheral portion; and
    a liquid recovery mechanism provided at an area outside the auxiliary member, where the area is the part of the surface layer of the substrate supporting side of the substrate support member.

14. The apparatus according to claim 12, further comprising:
    a liquid supply/drain mechanism to supply the liquid between the projection optical system and the substrate to be processed, and to drain unnecessary liquid between the projection optical system and the substrate.

15. A manufacturing method of a semiconductor device, carrying out an exposure process in a state that liquid is at least partly filled between a semiconductor substrate to be exposed and a projection optical system of an exposure apparatus carrying out the exposure process, comprising:
    carrying out a process of making a large contact angle between the liquid and at least an outer peripheral portion of a main surface of the semiconductor substrate when compared with a contact angle between the liquid and an area adjacent to the outer peripheral portion of the semiconductor substrate, the area being a part of a surface of a substrate supporting side of a substrate support member to support the semiconductor substrate included in the exposure apparatus; and forming a pattern on the main surface of the semiconductor substrate by carrying out the exposure process.

16. The method according to claim 15, further comprising:

providing a layer contacting with the liquid on the main surface at an angle larger than the contact angle of the liquid at the area of the substrate support member, the layer covering a resist layer during the process of making a large contact angle after providing the resist layer on the main surface of the semiconductor substrate.

17. The method according to claim 15, further comprising:

carrying out a water repellent treatment to the main surface of the semiconductor substrate during the process of making the large contact angle.

18. The method according to claim 15, wherein the liquid is any liquid containing pure water, ionized water, organic matter, and liquid containing a silicon compound.

19. A manufacturing method of a semiconductor device, carrying out an exposure process in a state that liquid is at least partly filled between a semiconductor substrate to be exposed and a projection optical system of an exposure apparatus to carry out the exposure process, comprising:

forming an absorption layer contacting with the liquid at a first angle on a main surface of a side to be exposed of the semiconductor substrate;

providing a resist layer on the absorption layer and on a surface facing the projection optical system;

providing a top coat layer contacting with the liquid at a second angle and covering the resist layer, the top coat layer being provided on the surface facing the projection optical system;

supporting the semiconductor substrate provided with the absorption layer, the resist layer, and the top coat layer by a substrate support member included in the exposure apparatus, and providing an auxiliary member contacting with the liquid at an angle smaller than the first angle at an area adjacent to the outer peripheral portion of the semiconductor substrate, the area being a part of a surface layer of the substrate supporting side of the substrate support member;

exposing a pattern onto the resist layer by carrying out the exposure process with respect to the semiconductor substrate; and forming the pattern on the main surface of the semiconductor substrate by developing the pattern.

20. The method according to claim 19, further comprising:

providing a layer for adjusting a phase of multiple reflection of exposure light used for the exposure process between the absorption layer and the resist layer.

* * * * *